(12) United States Patent
Coolbaugh et al.

(10) Patent No.: US 7,919,830 B2
(45) Date of Patent: Apr. 5, 2011

(54) METHOD AND STRUCTURE FOR BALLAST RESISTOR

(75) Inventors: Douglas D. Coolbaugh, Highland, NY (US); Ebenezer E. Eshun, Newburgh, NY (US); Zhong-Xiang He, Essex Junction, VT (US); Robert M. Rassel, Colchester, VT (US); Kimball M. Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 12/062,262

(22) Filed: Apr. 3, 2008

(65) Prior Publication Data

US 2009/0253239 A1    Oct. 8, 2009

(51) Int. Cl.
*H01L 21/8222*    (2006.01)

(52) U.S. Cl. .................... 257/565; 257/580; 257/E21.37
(58) Field of Classification Search .................. 257/565, 257/580
See application file for complete search history.

(56) References Cited

U.S. PATENT DOCUMENTS

| 6,531,745 B1 | 3/2003 | Woolery et al. |
| 2005/0133839 A1 | 6/2005 | Okushima |
| 2006/0063341 A1 | 3/2006 | Beasom |
| 2006/0267047 A1 | 11/2006 | Murayama |
| 2007/0034960 A1 | 2/2007 | Zhang et al. |

*Primary Examiner* — Alexander G Ghyka
(74) *Attorney, Agent, or Firm* — King & Spalding LLP (57) ABSTRACT

A method for fabricating a low-value resistor such as a ballast resistor for bipolar junction transistors. The resistor may be fabricated using layers of appropriate sheet resistance so as to achieve low resistance values in a compact layout. The method may rely on layers already provided by a conventional CMOS process flow, such as contact plugs and fully silicided (FUSI) metal gates.

2 Claims, 7 Drawing Sheets

METHOD AND STRUCTURE FOR BALLAST RESISTOR

FIELD OF THE INVENTION

This invention relates to semiconductor device fabrication, and more specifically to the fabrication of a low-value resistors such as ballast resistors to prevent thermal runaway in bipolar transistors.

BACKGROUND

Low-value resistors, of the order of a few ohm or less, find many applications in semiconductor circuits. One example is that of ballast resistors used as current limiters in bipolar junction transistors (BJTs). BJTs suffer from a phenomenon known as thermal runaway, which derives from the interaction between power dissipation and the temperature dependence of collector current. As a BJT carries current, it converts carrier energy into heat, the quantity of heat generated being proportional to the collector current. Due to the finite ability of the surrounding materials to remove heat, the device temperature increases. Moreover, the physical nature of current transport in BJTs is such that the collector current is exponentially sensitive to the device temperature, a higher temperature corresponding to a higher current for the same base-emitter voltage. This creates a positive feedback, in that an increase in current causes an increase in temperature, which in turn increases the current, and so on. Once thermal runaway is triggered it usually leads to the physical failure of the device. Prevention of thermal runaway requires efficient heat transfer from the BJT, which is sometimes difficult to achieve due to packaging, layout and material constraints.

A simple way to avoid thermal runaway is to add a low-value "ballast resistor" in series with the emitter. The ballast resistor is dimensioned in such a way to damp the positive feedback that causes thermal runaway. For example, a 2-ohm ballast resistor will reduce the base-emitter voltage by 2 millivolt for each additional milliampere of current. Since the emitter current is exponentially sensitive to the base-emitter voltage, such damping effect is generally sufficient to prevent thermal runaway. In addition to their use as ballast resistors, low-value resistors have other applications in radio-frequency (RF) and analog circuits which require resistance values in the range of a few ohm.

Known techniques for the fabrication of low-value resistors have a number of drawbacks. For example, silicided polysilicon normally employed in semiconductor fabrication has a typical sheet resistance of the order of 5-10 ohm/square. The fabrication of a 2-ohm resistor would require a short and wide resistor layout, with a typical width/length ratio between 2.5 and 5. Such wide resistor layout is impractical and uses a large amount of die area. Also, the sheet resistance of silicided polysilicon typically displays large fabrication variations, which result in corresponding large variations in resistance values. Metal interconnects such as aluminum or copper have a typical sheet resistance in the range of 0.05 ohm/square to 0.1 ohm/square. This requires a long and narrow resistor layout, with a typical length/width ratio of 20 or more, often implemented as a serpentine structure which also uses a significant amount of die area.

SUMMARY OF THE INVENTION

In one aspect, the invention provides a method of fabricating a ballast resistor. The method may include the steps of forming a dielectric layer by a shallow trench isolation process; forming a bipolar transistor having collector, base and emitter regions, the collector region of the bipolar transistor being in lateral contact with the dielectric layer; forming a contact bar over the dielectric layer by a contact plug process; and forming a metal pad over and in contact with a second end of the contact bar in the longitudinal direction. The contact bar may have a longitudinal dimension and a transverse dimension, the transverse dimension being smaller than a maximum dimension allowed by a design rule of the contact plug process. A first end of the contact bar in a longitudinal direction may be in electrical contact with the emitter region, and the contact bar may be isolated from the base region by a dielectric sidewall spacer. The resistance of the ballast resistor may be substantially determined by the ratio of the longitudinal dimension to the transverse dimension.

BRIEF DESCRIPTION OF THE DRAWINGS

Embodiments of the invention will now be described with reference to the appended drawings in which.

Drawings are only diagrammatic and not to scale. Corresponding elements in different drawings are indicated by the same numerals.

DETAILED DESCRIPTION

Figure 1:
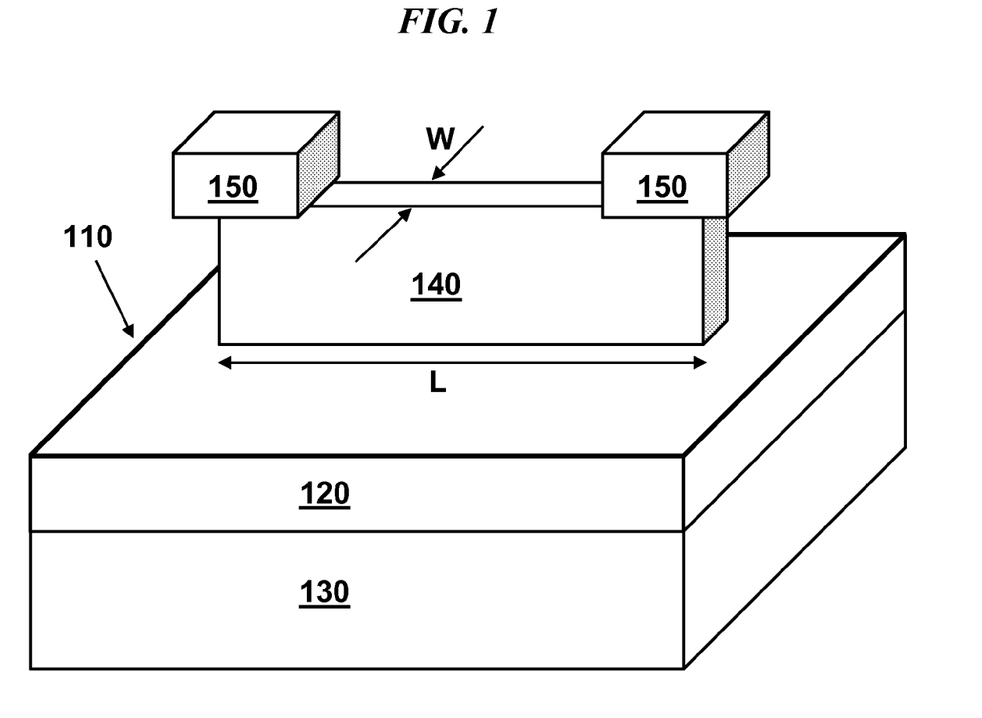
FIG. 1 shows a resistor structure in a first embodiment of the invention.

FIG. 1 shows a resistor structure in a first embodiment of the invention. The structure is shown as fabricated over a substrate 110 comprising a dielectric layer 120 formed over a semiconductor wafer 130. The dielectric layer 120 may be for example a shallow trench isolation (STI) layer in a conventional CMOS process flow. This arrangement is advantageous in that it allows the use of a standard CMOS process flow. Also, the substantial thickness of the STI layer minimizes the parasitic capacitance between the resistor structure and the substrate. Other embodiments of the invention may employ other substrates. For example the resistor structure may be formed over the CMOS active area of a semiconductor wafer, and may be isolated from the underlying wafer by a thin gate oxide. Alternatively, the resistor structure may be formed over a pre-existing metallization layer.

A contact bar 140 may be formed over the dielectric layer 120. The contact bar 140 may be any conductor carrying current in a lateral direction, and possibly also in a vertical direction. Current flow along the contact bar need not be uniformly oriented or distributed. While FIG. 1 shows a simple, rectilinear contact bar, embodiments of the invention may include a contact bar having bends and/or branches. Also, while FIG. 1 shows a contact bar with uniform thickness, embodiments of the invention may include a contact bar having a width that varies along the length of the contact bar.

Finally, a contact bar may follow the topology of any underlying substrate, and therefore be non-planar.

The contact bar may be formed by a contact plug process as is used in a conventional CMOS process flow. One such contact plug process would include the steps of contact window opening by dry etch, followed by adhesion/barrier layer deposition, tungsten deposition, and planarization by chemical-mechanical polishing (CMP). Such processes are well known in the art. Where the contact bar is formed over a pre-existing metallization layer, the contact plug employed may be a via process.

Contact plug processes are typically optimized to produce contacts with small cross-sections, as are normally employed to provide electrical contacts to the substrate and polysilicon layers. For that reason the design rules of known contact plug processes typically require a contact plug to have a lateral dimension not exceeding a certain maximum value. This may be due, for example, to the need for ensuring proper gap-filling during deposition of the tungsten, and avoiding dishing during a subsequent CMP step. However, as long as the design rule is met for at least one of the lateral dimensions of the contact bar, a conventional contact plug process may be employed even if the other lateral dimension exceeds the maximum value as specified in the design rule. In a preferred embodiment of the invention, the width (transverse dimension) of the contact bar, indicated with W in FIG. 1, is designed to be less than the maximum lateral dimension allowed by the contact plug process. The length (longitudinal dimension), indicated with L in FIG. 1, is not so constrained, and may be tailored to achieve a desired resistance value, as discussed below. In the context of this description, the terms "longitudinal" and "transverse" indicate directions substantially lying in the plane of the semiconductor wafer 130.

The first step in a contact plug process is usually the etching of a contact hole in the pre-metal dielectric. This dielectric is typically silicon dioxide, which is also the dielectric conventionally employed to form the dielectric layer 120 in an STI process. To allow the contact etch to stop on the surface of the dielectric layer 120, an intermediate etch stop may be employed, such as a thin conformal layer of silicon nitride (not shown). By using a contact etch process that is selective to silicon nitride, the bottom of the contact bar may be approximately aligned with the top surface of the dielectric layer without over-etch.

Unlike conventional contact plugs, which are typically square or round in cross-section, the contact bar 140 has an aspect ratio which may be precisely designed to achieve a predetermined value of resistance. In fact, the contact bar 140 may provide the bulk of the resistance of the resistor structure. However, instead of carrying current vertically, as in conventional contact plugs, current may travel predominantly in the lateral direction. The resistance of the contact bar is approximately $$R = R_S (L/W)$$

where L and W are the length (longitudinal dimension) and width (transverse dimension) of the contact bar. $R_S$ is the contact bar sheet resistance, which may be between 0.1 ohm/square and 1 ohm/square. Such values of sheet resistance may avoid the need for extremely wide layouts, as is the case for polysilicon resistor, and extremely narrow layouts, as is the case for metal resistors. For example, a contact bar with a resistance of 2 ohm and a sheet resistance of 0.5 ohm/square will have a length/width ratio around 4, which may be laid out on a relatively small die area.

The resistor structure may be completed by the formation of metal pads 150 located over the two ends of contact bar 140. Metal pads may provide electrical connections to other circuit elements, such as BJTs. Interconnects may also be formed by the same process steps that produce the metal pads 150. Metallization processes for the fabrication of metal pads are well known in the art. One such metallization process would include the steps of aluminum deposition, patterning of aluminum by dry etch, and deposition of an inter-metal dielectric (IMD). Other processes may be also used, such as copper metallization by a damascene process.

Figure 2:
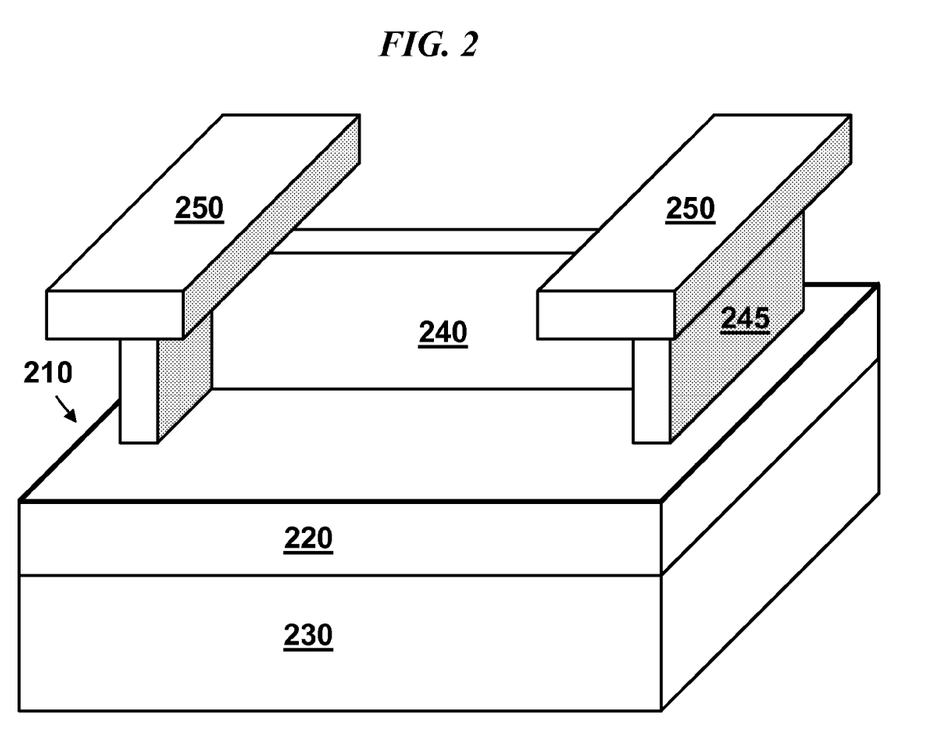
FIG. 2 shows a resistor structure in a second embodiment of the invention.

FIG. 2 shows a resistor structure in a second embodiment of the invention. Like the resistor structure of FIG. 1, the resistor structure of FIG. 2 may be formed over a substrate 210 which includes a dielectric layer 220 formed over a semiconductor wafer 230, and may be topped by metal pads 250 providing electrical contact. The second embodiment differs from the first embodiment by the presence of perpendicular portions 245 of the contact bar 240, forming a "dog-bone" structure as is well known in the art. The perpendicular portions 245 facilitate the alignment between the contact bar 240 and the metal pads 250, and prevent the formation of weak contacts and hot spots.

Figure 3:
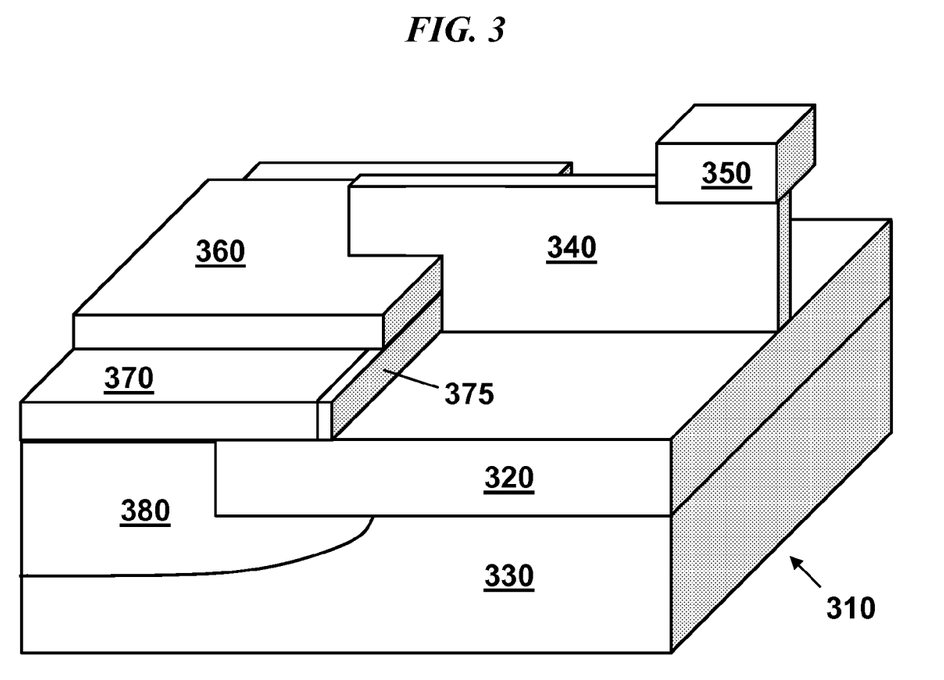
FIG. 3 shows an embodiment of the invention implementing a ballast resistor for a bipolar junction transistor (BJT).

FIG. 3 shows an embodiment of the invention implementing a ballast resistor for a bipolar junction transistor (BJT). The BJT may be formed on a substrate 310 which includes a dielectric layer 320 formed over a semiconductor wafer 330. The BJT comprises an emitter 360, a base 370 and a collector 380. The emitter 360 and base 370 may be formed of polysilicon, while the collector 380 may be formed by selectively doping a region of the semiconductor wafer 330. The fabrication of bipolar transistors is well known in the art. The dielectric layer 320 may surround the collector 380. This embodiment of the invention includes a contact bar 340, formed over the dielectric layer 320, which makes electrical contact with the emitter 360 at one end, and with a metal pad 350 at the other end. In this way, the contact bar 340 implements a ballast resistor that is series-connected with the emitter of the BJT and prevents thermal runaway. To prevent short-circuiting the emitter and base, this embodiment of the invention includes a dielectric sidewall spacer 375 which isolates the contact bar 340 from the base 370. Sidewall spacers are known in the art and may be formed, for example, of silicon dioxide, silicon nitride or other common insulating materials.

Figure 4:
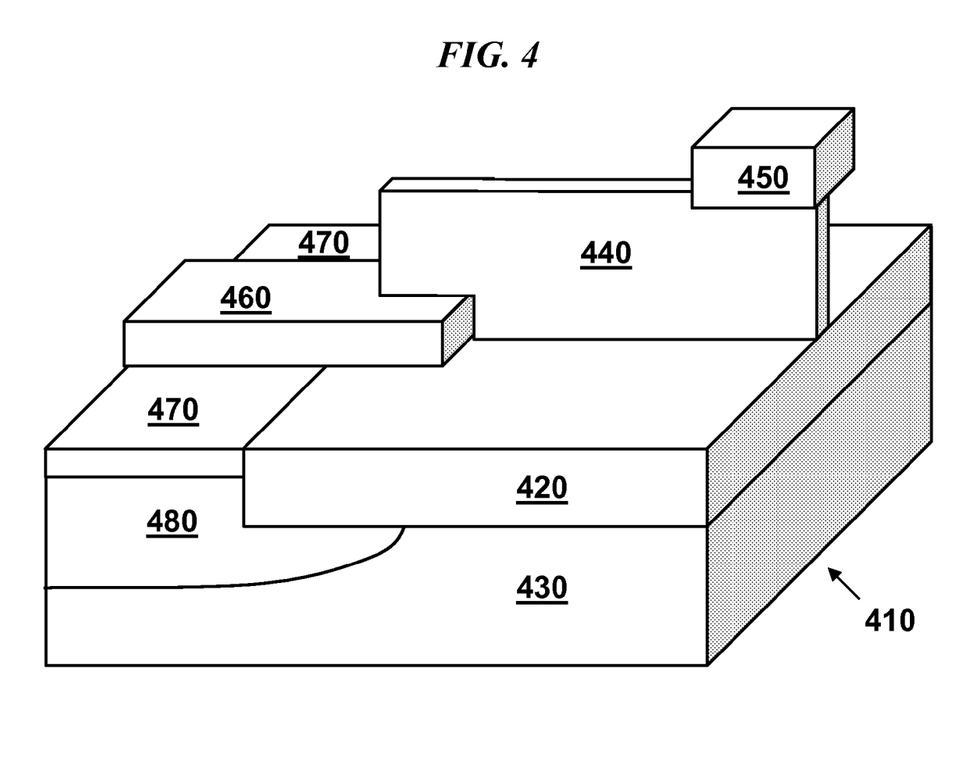
FIG. 4 shows an embodiment of the invention implementing a gate series resistor for a metal-oxide-semiconductor field-effect transistor (MOSFET).

FIG. 4 shows an embodiment of the invention implementing a gate series resistor for a metal-oxide-semiconductor field-effect transistor (MOSFET). The MOSFET may be formed over a substrate 410 which includes a dielectric layer 420 formed over a semiconductor wafer 430. The MOSFET includes gate 460, source/drain regions 470 and body or well 480. The gate 460 may be formed of polysilicon, silicided polysilicon, or metal. Source/drain regions may be formed of heavily doped silicon or silicided silicon. The well 480 is conventionally formed by selectively doping a region of the semiconductor wafer 430. MOSFET fabrication processes are well known in the art. This embodiment of the invention includes a contact bar 440 which makes electrical contact with the gate 460 at one end, and with a metal pad 450 at the other end. In this way, the contact bar 440 implements a resistor that is series-connected with the MOSFET gate 460.

Figure 5:
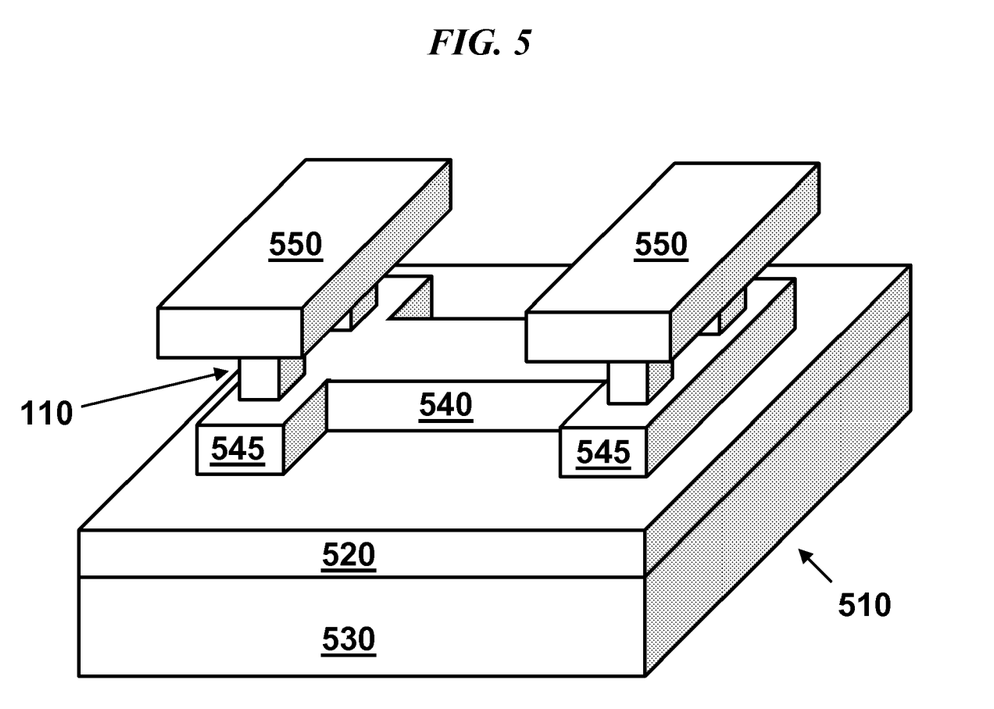
FIG. 5 shows a resistor structure in an embodiment of the invention employing a fully silicided (FUSI) metal gate layer.

FIG. 5 shows a resistor structure in an embodiment of the invention employing a fully silicided (FUSI) metal gate layer. The FUSI process relies on the silicidation of the gate polysilicon to form a gate electrode of nickel silicide (NiSi). The sheet resistance of the resulting NiSi gate is substantially lower than that of conventional silicided polysilicon, allowing the fabrication of compact low-value resistors. The resistor structure may be formed over a substrate 510 which includes a dielectric layer 520, such as an STI layer, formed over a semiconductor wafer 530, and may be topped by metal pads 550 providing electrical contact. The resistor structure may also include a metal gate bar 540 having optional perpendicular portions 545 at its ends. The metal gate bar 540 and the perpendicular portions 545 may be formed by a FUSI process. The perpendicular portions 545 may be connected to metal pads 550 by contact plugs 110.

Figure 6:
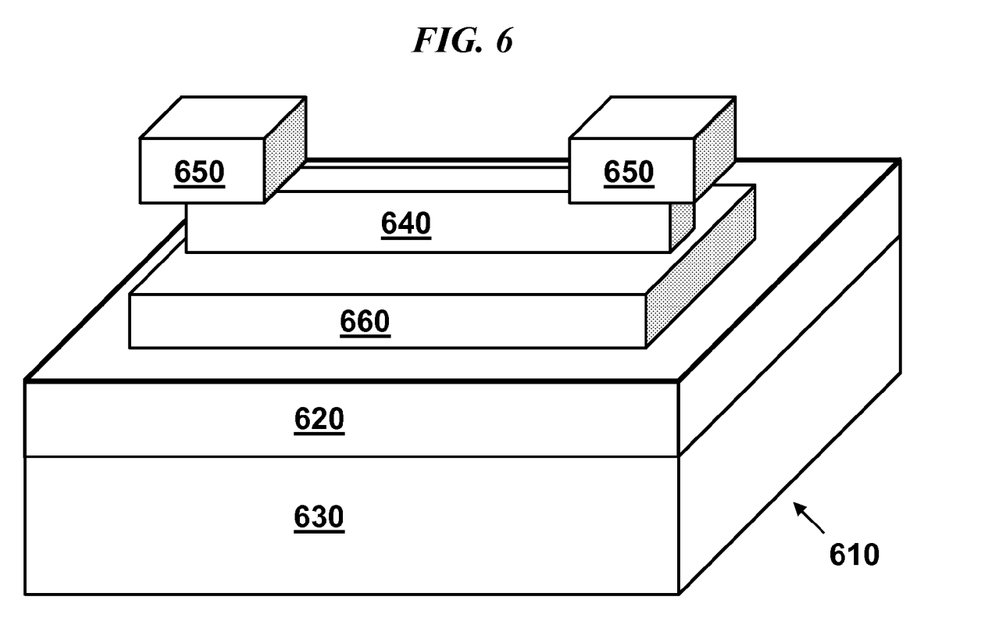
FIG. 6 shows a resistor structure in an embodiment of the invention requiring higher resistance values.

FIG. 6 shows a resistor structure in an embodiment of the invention requiring higher resistance values. For contact plug processes resulting in a thick contact bar, the sheet resistance of the contact bar may be less than desired, for example in the range of 0.1 ohm/square to 0.3 ohm/square. As a general proposition, the sheet resistance of a layer of finite thickness increases with decreasing layer thickness. Therefore, the sheet resistance of the contact bar may be increased by decreasing the thickness of the contact bar. The structure is shown as fabricated over a substrate 610 comprising a dielectric layer 620 formed over a semiconductor wafer 630. Compared with the embodiment of FIG. 1, the embodiment of FIG. 6 may include an additional layer 660 formed between the dielectric layer 620 and the contact bar 640. Since the total thickness of the contact layer is fixed in most contact plug processes, the presence of the additional layer 660 may reduce the thickness of the contact bar and thus increase its sheet resistance. For example, if a contact bar has a sheet resistance of 0.2 ohm/square, halving its thickness will typically double the sheet resistance to around 0.4 ohm/square. Preferably, the additional layer 660 is a layer that is already provided by the CMOS process flow. Both insulating and conducting layers may be employed to form the additional layer 660. The additional layer 660 may be, for example, the gate polysilicon layer. Since the contact bar is typically highly conductive, there may be no need to provide an insulation layer between the contact bar 640 and the additional layer 660, even if the latter is conductive, since the overall resistance of the resistor structure will not normally be greatly affected by parallel conduction in the additional layer 660.

Figure 7:
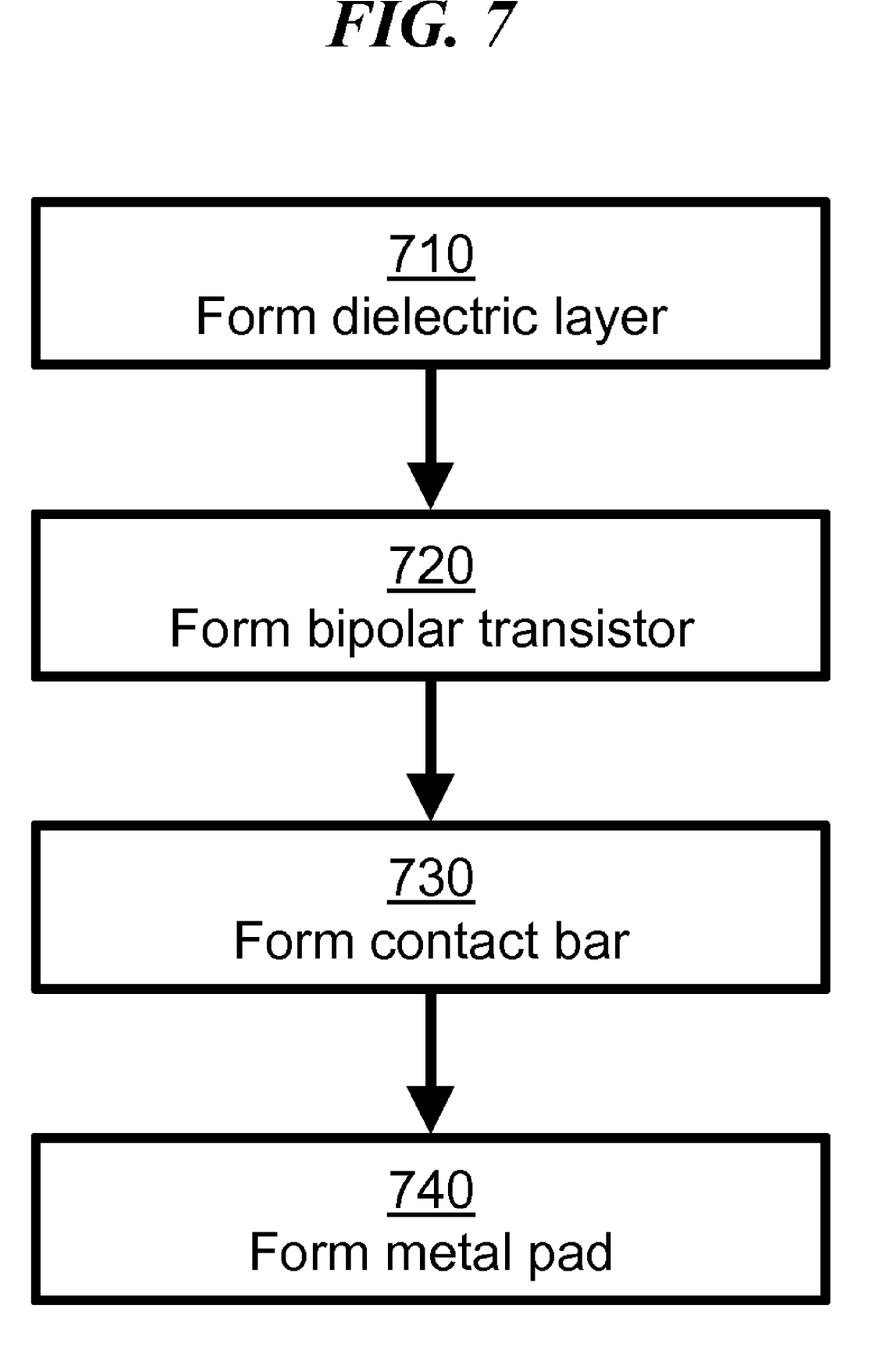
FIG. 7 shows an exemplary fabrication process for a resistor structure in an embodiment of the invention similar to that shown in FIG. 3.

FIG. 7 shows an exemplary fabrication process for a resistor structure in an embodiment of the invention similar to that shown in FIG. 3. This example assumes that the fabrication of the resistor structure is integrated within a conventional bipolar or bipolar/CMOS (BiCMOS) process flow; modifications of the process to adapt it to other process flows will be apparent to a person skilled in the art. The process may begin at step 710 with the formation of a dielectric layer, such as the dielectric layer 320 of FIG. 3. This may be done, for example, by a conventional shallow-trench isolation (STI) process module, prior to the formation of the active devices. At step 720, a bipolar transistor may be formed, including for example collector, base and emitter regions formed as stacked layers, as regions 380, 370 and 360, respectively, in FIG. 3. It is understood that other active or passive devices may be substituted for the bipolar transistor, such as the MOSFET of FIG. 4. Also, the exact order of formation of the dielectric layer and active devices will depend on the specific process flow employed. Other process flows, for example, may form the dielectric layer as an insulation after the active devices have been formed. At step 730, a contact bar may be formed, for example by a conventional contact plug process. At step 740, a metal pad may be formed to provide an electrical connection to the contact bar. The metal pad formation is optional if the interconnection to the other devices on the same integrated circuit is provided by the same material that is used to form the contact bar, for example by a dual-damascene process.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in conjunction with specific embodiments, it will be appreciated that such embodiments are not limiting. Accordingly, numerous alternatives, modifications, and variations are possible within the scope of the appended claims.

We claim:

1. A semiconductor device comprising:
    a dielectric layer formed by a shallow trench isolation process;
    a bipolar transistor having collector, base and emitter regions, the collector region being in lateral contact with the dielectric layer;
    a contact bar formed by a contact plug process over the dielectric layer, the contact bar having a longitudinal dimension and a transverse dimension, a first end of the contact bar in a longitudinal direction being in electrical contact with the emitter region, the contact bar being isolated from the base region by a dielectric sidewall spacer;
    a metal pad disposed over and in contact with a second end of the contact bar in the longitudinal direction; and
    a layer of conductive material formed between the contact bar and the dielectric layer to increase a sheet resistance of the contact bar;
    whereby the resistance of a ballast resistor comprising the contact bar is substantially determined by the ratio of the longitudinal dimension to the transverse dimension and the sheet resistance of the contact bar.

2. The semiconductor device of claim 1, wherein the layer of conductive material comprises polysilicon.

* * * * *